US008638174B2

(12) United States Patent
Pavlovic et al.

(10) Patent No.: US 8,638,174 B2
(45) Date of Patent: Jan. 28, 2014

(54) DIGITAL SIGNAL GENERATOR

(75) Inventors: Nenad Pavlovic, Eindhoven (NL);
Johannes Hubertus Antonius Brekelmans, Nederweert (NL); Jan van Sinderen, Liempde (NL)

(73) Assignee: Integrated Device Technology inc., San Jose, CA (US)

( * ) Notice: Subject to any disclaimer, the term of this patent is extended or adjusted under 35 U.S.C. 154(b) by 125 days.

(21) Appl. No.: 13/116,967

(22) Filed: May 26, 2011

(65) Prior Publication Data

US 2011/0291732 A1    Dec. 1, 2011

(30) Foreign Application Priority Data

May 26, 2010   (EP) .................................... 10250980

(51) Int. Cl.
*H03B 27/00* (2006.01)
*G06F 1/04* (2006.01)
*H04B 1/10* (2006.01)
*H04B 1/16* (2006.01)

(52) U.S. Cl.
USPC ............. 331/45; 327/299; 375/350; 375/351; 455/208; 455/258; 455/318

(58) Field of Classification Search
USPC ............. 327/298, 299; 331/45; 375/350, 351; 455/196.1, 197.1, 208, 209, 255, 257, 455/258, 293, 315, 316, 318
See application file for complete search history.

(56) References Cited

U.S. PATENT DOCUMENTS

| 4,615,040 | A  | * | 9/1986 | Mojoli et al. ................. 375/267 |
| 6,795,487 | B1 | * | 9/2004 | Bickerstaff et al. ........... 375/147 |
| 7,786,786 | B2 | * | 8/2010 | Kirichenko .................... 327/295 |
| 2004/0190660 | A1 | * | 9/2004 | Morris et al. ................. 375/350 |
| 2010/0253412 | A1 |   | 10/2010 | Brekelmans et al. |

FOREIGN PATENT DOCUMENTS

| CN | 1256023 A | 6/2000 |
| CN | 101076943 A | 11/2007 |
| EP | 1693966 A1 | 8/2006 |
| WO | 2009/057051 A2 | 5/2009 |

OTHER PUBLICATIONS

Greshishchev, Y., et al. "A Fully Integrated SiGe Reciever IC for 10-Gb/s Data Rate", IEEE J. of Solid-Sate Circuits, vol. 35, No. 12, pp. 1949-1957 (Dec. 2000).

(Continued)

*Primary Examiner* — Levi Gannon
(74) *Attorney, Agent, or Firm* — Hayes and Boone LLP (57) ABSTRACT

The invention relates to a digital signal generator for providing one or more phases of a local oscillator signal for use in digital to analogue converters and harmonic rejection mixers. Embodiments disclosed include a local oscillator signal generator (200) for a mixer of a radiofrequency receiver, the signal generator (200) comprising a bit sequence generator (201) having a plurality of parallel output lines (203), a digital signal generator (202) having a serial output line (204) and a plurality of input lines connected to respective output lines (203) of the bit sequence generator (201) and a clock signal input line (205), wherein the digital signal generator (202) is configured to provide an output bit sequence on the serial output line (204) at a rate given by a clock signal provided on the clock signal input line (205) and a sequence given by a sequence of bits from the bit sequence generator (201) on the plurality of input lines (203).

10 Claims, 10 Drawing Sheets

(56) References Cited

OTHER PUBLICATIONS

Sasaki, N. et al. "A Single-Chip Ultra-Wideband Receiver With Silicon Integrated Antennas for Inter-Chip Wireless Interconnection", IEEE J. of Solid-Sate Circuits, vol. 44, No. 2, pp. 382-393 (Feb. 1, 2009).

Jeong, J. et al. "A CMOS 3.2 Gb/s 4-PAM Serial Link Transceiver", IEEE SOC Design Conf., pp. 408-411 (Nov. 2009).

Farzan, K. et al. "A CMOS 7-GB/s Power-Efficient 4-PAM Transmitter", 2002 Solid-State Circuits Conf., pp. 235-238 (Sep. 2002).

Lin, B. et al. "A 1-μm MODFET Process Yielding MUX and DMUX Circuits Operating at 4.5 Gb/s", IEEE GaAs IC Symposium, pp. 143-146 (Nov. 1988).

Hanke, G. "Experimental Synchronous 10 GBIT/S Transmission System for Optical Fibers", SBMO Int'l. Microwave Conf./Brazil, pp. 657-662 (Aug. 1993).

Felder, A. et al. "10 GBit/s Word Generator Based on Silicon Bipolar Circuitry", Proc. of the European Microwave Conf., vol. conf. 19, pp. 833-838 (Sep. 1989).

Tanaka, K. et al. "High Speed 8:1 Multiplexer and 1:8 Demultiplexer ICs using GaAs DCFL Circuit", IEEE GaAs IC Symposium, pp. 229-232 (Oct. 1991).

Extended European Search Report for European Patent Apppln. No. 10250980.9 (Nov. 8, 2010)xxx.

Maxim, A. et al. "A DDFS Driven Mixing-DAC with Image and Harmonic Rejection Capabilities", IEEE Solid-State Circuits Conf., pp. 372, 373, 621 (Feb. 2008).

Mensink, E. et al. "Distortion Cancellation by Polyphase Multipath Circuits", IEEE Trans. on Circuits and Systems—I: Regular Papers, vol. 52, No. 9, pp. 1785-1794 (Sep. 2005).

Brekelmans, J. et al. "Design of a Reconfigurable Multi-Phase LO Generator for a Harmonic Reject Mixer in CMOS065", NXP Semiconductors Tech. Note, 81 pgs (2008).

First Office Action mailed Aug. 2, 2013, in related Chinese Patent Application No. 201110137970.2.

S. Yang, "Study on Ultrahigh Speed Multiplexer Integrated Circuit", China Doctor Dissertation Full-text Database, Jun. 11, 2007.

\* cited by examiner

DIGITAL SIGNAL GENERATOR

The invention relates to a digital signal generator for providing one or more phases of a local oscillator signal for use in digital to analogue converters and harmonic rejection mixers.

Figure 1:
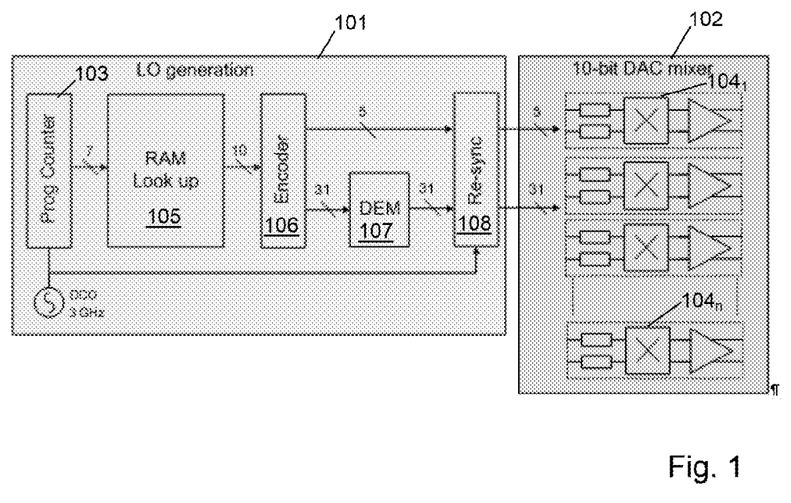
FIG. 1 is a schematic diagram of a combined digital LO generator and 10-bit DAC mixer.

As part of the process of down-conversion in broadband RF receivers such as television tuners, digital to analogue converters (DACs) and harmonic rejection mixers are often used [see for example references 1 or 3]. A DAC mixer in such a receiver can be configured to approximate a sine wave mixing waveform by combining the outputs of several hard-switching sub-mixers driven by a multi-phase digital local oscillator (LO) signal. An exemplary system is illustrated in FIG. 1, in which an LO generation module 101 provides a multi-phase LO signal to a 10-bit DAC mixer 102. The multi-phase LO signal drives a number of sub-segment mixers $104_1$-$104_n$ in the DAC mixer 102, and a weighted summed output of the DAC mixer 102 delivers a down-converted product of the received RF signal.

The LO generation module 101 comprises a programmable counter 103, which is usually implemented by cascading multiple simple dividers with a different modulus. The output of the programmable counter 103 is used to address a RAM look-up table (LUT) 105, the output of which is provided to an encoder 106 to generate a multi-phase LO signal.

The type of multi-phase LO generator shown in FIG. 1, and disclosed in reference 1, requires the use of delay-locked loops (DLLs) to synchronise the different outputs. Such an approach is complex, because both dynamic element matching (DEM) 107 and synchronisation 108 have to be carried out at high frequency and in one step.

It is an object of the invention to address one or more of the above mentioned problems.

In accordance with a first aspect of the invention there is provided a local oscillator signal generator for a mixer of a radiofrequency receiver, the signal generator comprising:
- a bit sequence generator having a plurality of parallel output lines;
- a digital signal generator having a serial output line and a plurality of input lines connected to respective output lines of the bit sequence generator; and
- a clock signal input line, wherein the digital signal generator is configured to provide an output bit sequence on the serial output line at a rate given by a clock signal provided on the clock signal input line and a sequence given by a sequence of bits from the bit sequence generator on the plurality of input lines.

An advantage of the invention is that of flexibility combined with the ability to ensure a synchronised output signal, due to the use of a parallel digital signal input that defines the serial output signal and the use of a single clock signal to control the digital signal generator, which acts as a multiplexer. Multiple such generators can be combined, with a common clock signal, for a multi-phase digital LO generator.

The bit sequence generator may be in the form of a memory, a counter or a look-up table, comprising $2^n$ parallel output lines connected to parallel inputs of multiplexer modules of the $n^{th}$ stage, where n is a positive integer. An advantage of using a memory for the bit sequence generator is that the parallel digital input can be arbitrarily changed to produce a different sequence of bits in the serial output signal, allowing the generator to produce a wider range of output signals, whereas the simpler construction of a look-up table or counter can be used in situations where less flexibility is required, for example where only set sequences of bits are required.

The digital signal generator may comprise a plurality of parallel to serial multiplexer modules, each multiplexer module configured to provide a serial output from a pair of parallel inputs under control of a clock signal input, the multiplexer modules arranged in stages from a first stage comprising one multiplexer module to an $n^{th}$ stage comprising $2^{n-1}$ multiplexer modules, the second to $n^{th}$ stage having twice the number of modules of a preceding stage and having serial outputs connected to parallel inputs of modules of the immediately preceding stage.

An advantage of the hierarchical tree arrangement of multiplexer modules is that only the first stage needs to operate at the highest clock frequency, the other stages operating at progressively lower frequencies.

To enable the various multiplexer modules to operate at different clock frequencies, the local oscillator signal generator may comprise n-1 clock signal dividers configured to provide an output clock signal at half the rate of an input clock signal and connected between clock signal inputs of multiplexer modules of adjacent stages, wherein the clock signal input line is connected to a first one of the clock signal dividers and to the clock signal input of the multiplexer module of the first stage such that the multiplexer module of the first stage provides the serial digital signal output at the rate of a clock signal applied to the clock signal input line. In this way, a minimum number of dividers is required to operate the digital signal generator and all of the clock signals are synchronised with each other.

Where the bit sequence generator is required to provide different sequences of bits at the parallel inputs of the digital signal generator, an output of the n-1$^{th}$ clock signal divider may be connected to a clock signal input of the bit sequence generator, which is in this case preferably a memory module. The bit sequence generator may thereby be configured to provide successive bit sequences to the parallel inputs of multiplexer modules of the $n^{th}$ stage in response to successive pulses of a clock signal applied to the clock signal input from the n-1$^{th}$ clock signal divider.

The bit sequence generator operates at a much lower frequency than the frequency of the output of the digital signal generator, which can significantly reduce the required complexity of the generator.

The output of the n-1$^{th}$ clock signal divider may be connected to the clock signal input of the bit sequence generator via an inverter, which enables the bit sequence generator to be triggered to provide a new bit sequence before the $n^{th}$ stage multiplexer modules are clocked to read the bit sequence.

The number n in each of the embodiments of the invention is a positive integer, and is preferably greater than 2. Embodiments disclosed herein have a value of n=3 or n=4, but other values for n may be chosen.

Embodiments of the invention may include a local oscillator signal generator configured to provide a plurality of serial digital output signals, the signal generator comprising a plurality of digital signal generators according to the first aspect of the invention, wherein the digital signal generators are connected to a common clock signal input. An advantage of such an arrangement is that the different local oscillator signals are synchronised with each other, while retaining the flexibility of having different signals provided from each generator.

Embodiments of the invention may also include a local oscillator signal generator configured to provide a plurality of phase shifted digital output signals, the signal generator comprising a digital signal generator according to the first aspect of the invention and further comprising a sequence of shift registers connected in series to the serial output of the digital signal generator. This arrangement allows for a phased sequence of local oscillator signals to be derived from a common generator, which can be used in generating an accurate local oscillator signal for mixing with an RF received signal.

In accordance with a second aspect of the invention there is provided a method of operating a local oscillator signal generator according to the first aspect, the method comprising:

the bit sequence generator generating a sequence of bits and providing the sequence at the plurality of parallel output lines to the digital signal generator;

the digital signal generator providing an output bit sequence on the serial output line at a rate given by the clock signal provided on the clock signal line and a sequence given by the sequence of bits from the bit sequence generator.

The method may further comprise providing the bit sequence on the serial output line to a mixer for converting an input radiofrequency signal.

Exemplary embodiments according to the invention are described in further detail below, with reference to the accompanying drawings, in which.

Figure 2:
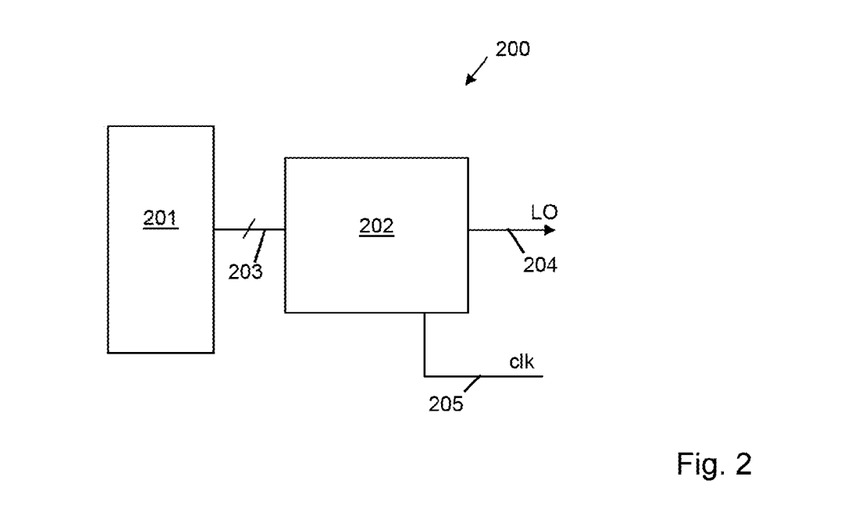
FIG. 2 is a schematic diagram of a local oscillator signal generator according to an embodiment of the invention.

An exemplary embodiment of a local oscillator signal generator 200 is illustrated in FIG. 2. The local oscillator signal generator 200 comprises a bit sequence generator in the form of a memory 201, having a plurality of parallel output lines 203, a digital signal generator 202 having a serial output line 204 and a plurality of input lines connected to respective output lines 203 of the memory 201. A clock signal input line 205 provides a clock signal clk to the digital signal generator. The digital signal generator 202 is configured to provide an output bit sequence on the serial output line 204 at a rate that is given by the clock signal clk provided on the clock signal input line 205 and from a sequence that is given by a sequence of bits provided from the memory 201 on the plurality of input lines 203. In operation, the memory 201 may be configured to provide a new sequence of bits on lines 203 after a set number of clock cycles that is equal to the number of lines 203, and the sequence of bits output each clock cycle on the serial output line 204 corresponds to the sequence of bits provided by the memory 201. This allows for flexibility of how the output digital sequence is generated, with the number of possibilities of bit sequences given by the number of input lines 203 and by updating the sequence of bits provided on the lines 203 after each set number of clock cycles.

Figure 3:
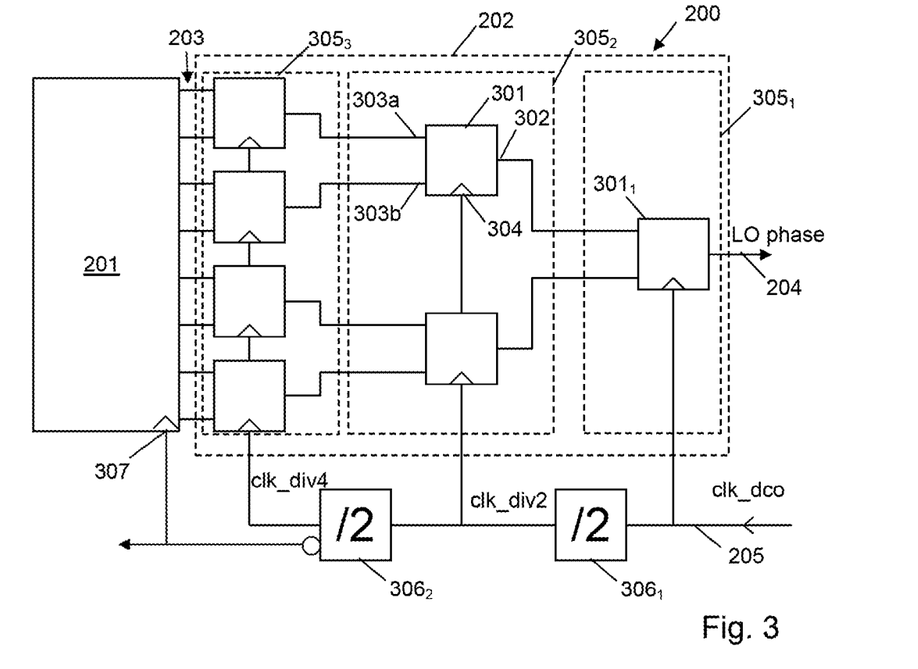
FIG. 3 is a more detailed schematic diagram of the local oscillator signal generator of FIG. 2.

A more detailed exemplary embodiment of a local oscillator signal generator 200 is illustrated in FIG. 3. The digital signal generator 200 comprises multiple stages $305_1$, $305_2$, $305_3$, each stage having one or more multiplexer modules 301. A first stage $305_1$ has one such module $301_1$, and subsequent stages $304_2$, $304_3$ have twice the number of modules of the immediately preceding stage. Each multiplexer module 301 has a pair of parallel inputs 303a, 303b, and a single serial output 302, and is configured to provide a serial bit sequence on the output line 302 corresponding to the bits provided in parallel on the input lines 302a, 302b according to a clock signal provided on a clock input 304.

Serial outputs of modules in the second and third stages $305_2$, $305_3$ are connected to parallel inputs of modules in the first and second stages $305_1$, $305_2$ respectively. The modules are thereby arranged in a tree-like hierarchical structure, in which a bit sequence input on parallel inputs of the third stage $305_3$ propagate down the tree to be provided on the serial output line 204 of the digital signal generator 200, which corresponds to the output of the first multiplexer module $301_1$. To control this sequence of propagation, an input clock signal clk_dco provided to the module $301_1$ of the first stage $305_1$ is also provided to a first clock signal divider $306_1$. The first clock signal divider $306_1$ provides a second clock signal clk_div2, which is at half the rate of the input clock signal clk_dco. The second clock signal clk_div2 is provided to clock inputs of modules in the second stage $305_2$, and to a second clock signal divider $306_2$. The second clock signal divider $306_2$ provides a third clock signal clk_div4, which is at half the rate of the second clock signal clk_div2 and therefore a quarter the rate of the input clock signal clk_dco. The third clock signal clk_div4 is provided to clock inputs of modules in the third stage $305_3$.

As a result of the halved clock signals being provided to stages of the generator 200 each having double the number of multiplexer modules of preceding stages, a bit sequence provided at the parallel inputs of the modules of the third stage $305_3$ is provided to the modules of the second stage $305_2$ and then to the first stage $305_1$, and is provided at the serial output 204 of the multiplexer module $301_1$ of the first stage $305_1$ over eight clock cycles of the input clock signal. The order in which the bit sequence is provided on the output line 204 therefore depends on the arrangement of parallel inputs on which the bit sequence is provided to the third stage $305_3$.

The signal generator 200 can be reconfigured by loading a different bit sequence to the parallel inputs 203 of the digital signal generator 202. This may be achieved for example by the use of a bit sequence generator in the form of a memory or as a look-up table (LUT) or counter. The use of a memory allows for greater flexibility in terms of the range of operations the generator can carry out, while the use of a look-up table or counter may be sufficient for many applications where a set sequence of bits is required.

Figure 4:
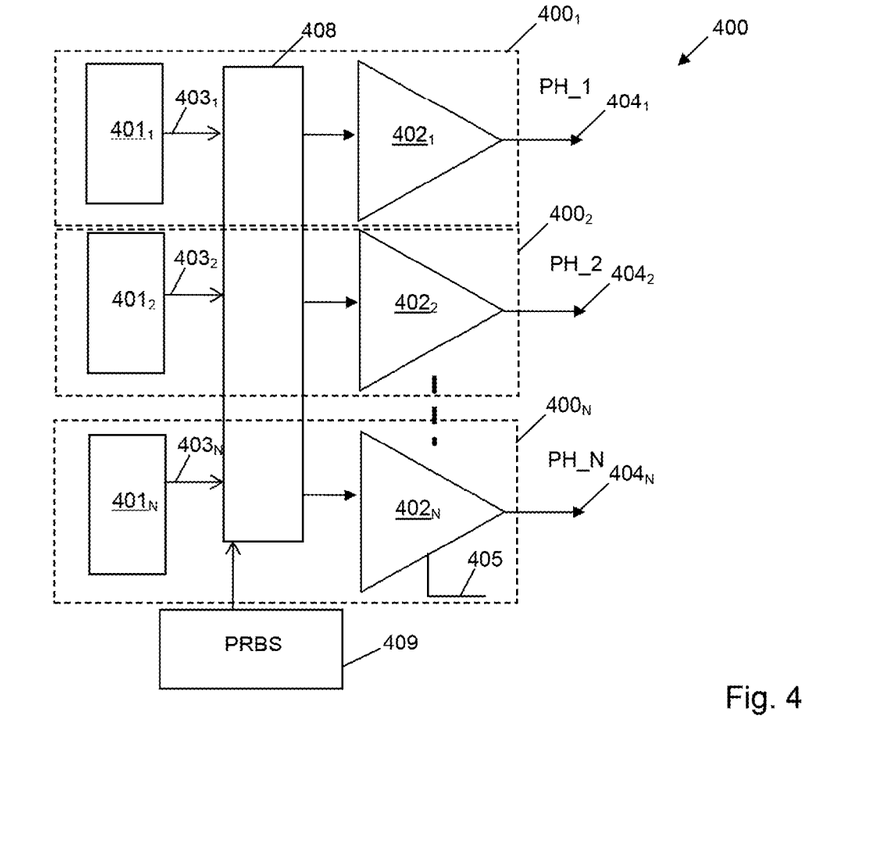
FIG. 4 is a schematic diagram of a multi-phase local oscillator signal generator.

An embodiment of a local oscillator signal generator 400 in which multiple digital signal generators of the type described above are used in parallel is illustrated in FIG. 4. A plurality of signal generators $400_1, 400_2 \ldots 400_N$ are arranged together for generating a multi-phase local oscillator signal. Each signal generator comprises a bit sequence generator $401_1$, $401_2 \ldots 401_N$, each having a plurality of parallel output lines $403_1, 403_2 \ldots 403_N$. The output lines $403_1, 403_2 \ldots 403_N$ may be connected directly to respective digital signal generator modules $402_1, 402_2 \ldots 402_N$, or alternatively may be connected via a bit shifter module 408, as shown in FIG. 4. The bit shifter module 408 is configured to switch which bit sequence is provided from each of the bit sequence generators $401_1$, $401_2 \ldots 401_N$ to each digital signal generator $402_1, 402_2 \ldots 402_N$ in dependence on an input bit sequence. Where multiple signal generators are used, this allows a process of dynamic element matching to be implemented in the digital domain by interchanging bit sequences from each of the memory modules $401_1, 401_2 \ldots 401_N$ among the signal generator modules $402_1, 402_2 \ldots 402_N$. The input bit sequence may for example be a pseudo-random bit sequence (PRBS) provided by a PRBS generator 409, or may be a simple cyclic bit shifter. A clock signal input line 405 provides a clock signal to each of the digital signal generator modules, ensuring that the output signals from each of the serial output lines $404_1, 404_2 \ldots 404_N$ are synchronized. A result of this is to lower the generation of digital spurs that may arise due to timing errors and mismatches between different parts of the generator 400. An advantage of this approach is that the cyclic bit shifter is operated at a lower frequency than the clock signal at which the different phase outputs are provided, thereby allowing for a simpler design.

In preferred embodiments, signals provided on the output lines $404_1, 404_2 \ldots 404_N$ are phase shifted relative to each other, with a phase shift that is coded by the bit sequence provided from each of the memory modules $401_1, 401_2 \ldots 401_N$. On combining the phase-shifted signals, a resulting output local oscillator signal has a reduced magnitude of higher harmonic components.

A circuit diagram of an exemplary multiplexer module 301 for use in the digital signal generators described above is illustrated in FIG. 5, the module 301 having two parallel input lines 303a, 303b and a single serial output line 302, i.e. corresponding to the module 301 of FIG. 3. The module 301 comprises a number of gated inverters 501, each of which may be configured to be in a sample mode or a hold mode. When enabled by a clock signal in a sample mode, an output of each inverter is the inverted level of an input, because the information is in the charge at the input capacitor of the next inverter. When the inverter is disabled it is in a hold mode.

Figure 5:
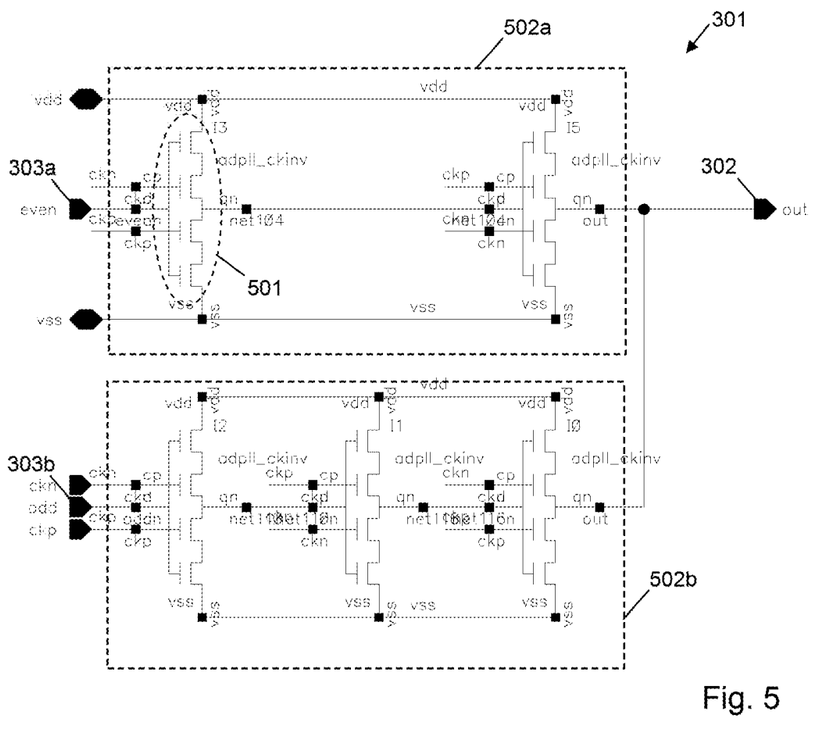
FIG. 5 is a circuit diagram of an exemplary multiplexer module.

The multiplexer module 301 comprises two paths: an even path 502a comprising two inverters and an odd path 502b comprising three inverters. Each path reads one sample from an adjacent stage or a bit sequence generator on a rising edge of a positive clock signal ckp. On a falling edge of the clock signal the even path 502a sends the sample to the output line 302, while the odd path 502b sends a sample to a second inverter and then to the output line 302 only on a next rising edge of the clock signal. As a result, the input samples are read in parallel and are transmitted sequentially in serial at double the rate of the input.

Figure 6:
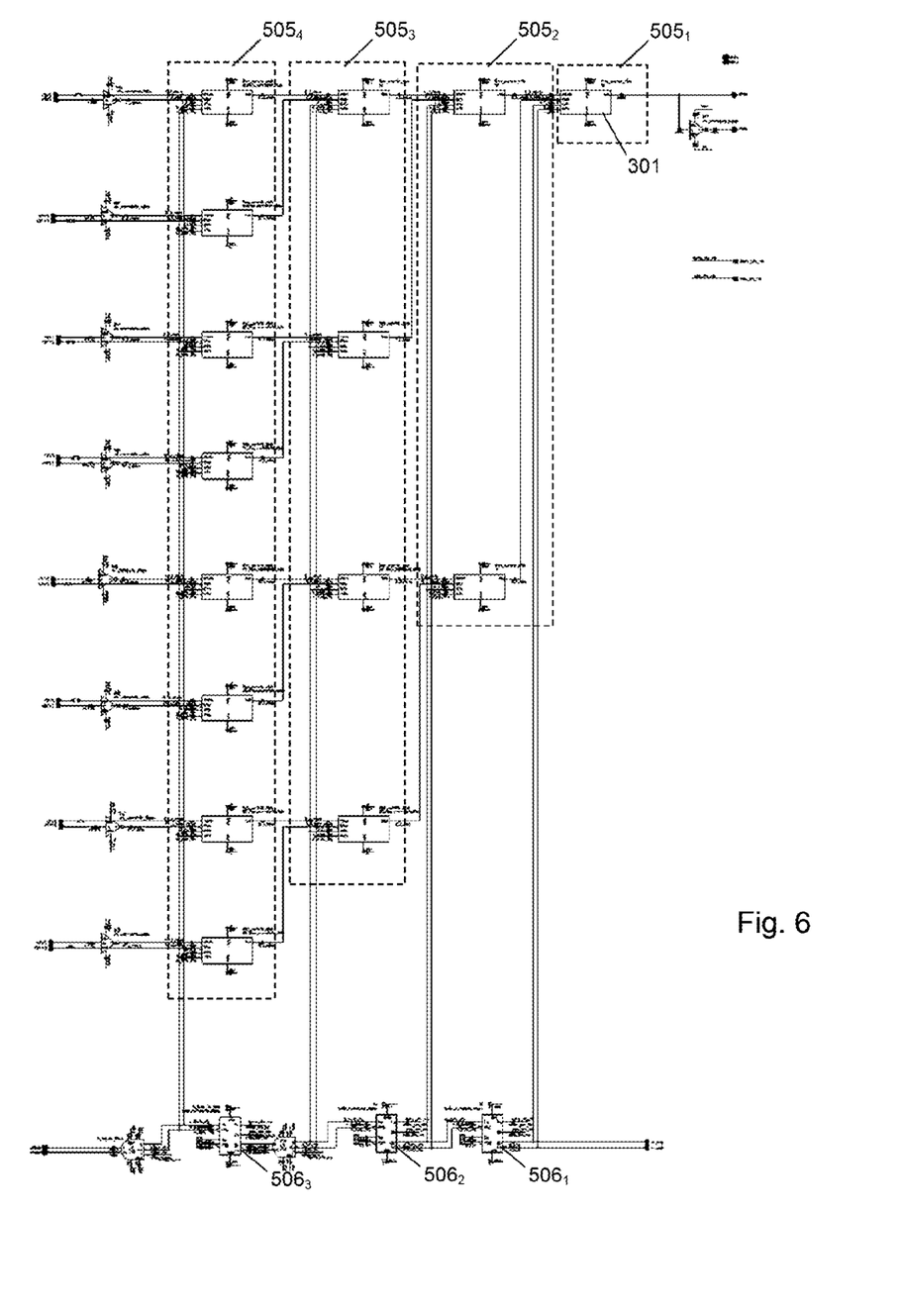
FIG. 6 is a circuit diagram of an exemplary arrangement of multiplexer modules and clock dividers making up a digital signal generator.

An exemplary embodiment of a digital signal generator, in which multiplexer modules 301 of the type described above are arranged in a hierarchical tree structure, is illustrated in FIG. 6. The multiplexer modules 301 are arranged in four stages $505_{1-4}$, and transfer a 16 bit sequence provided in parallel at the inputs of the 8 modules of the fourth stage $505_4$ to a serial bit sequence at the output of the first stage $505_1$. Clock signal dividers $506_{1-3}$ are connected between each stage to provide a successively divided clock signal to control the modules of each stage.

Figure 7:
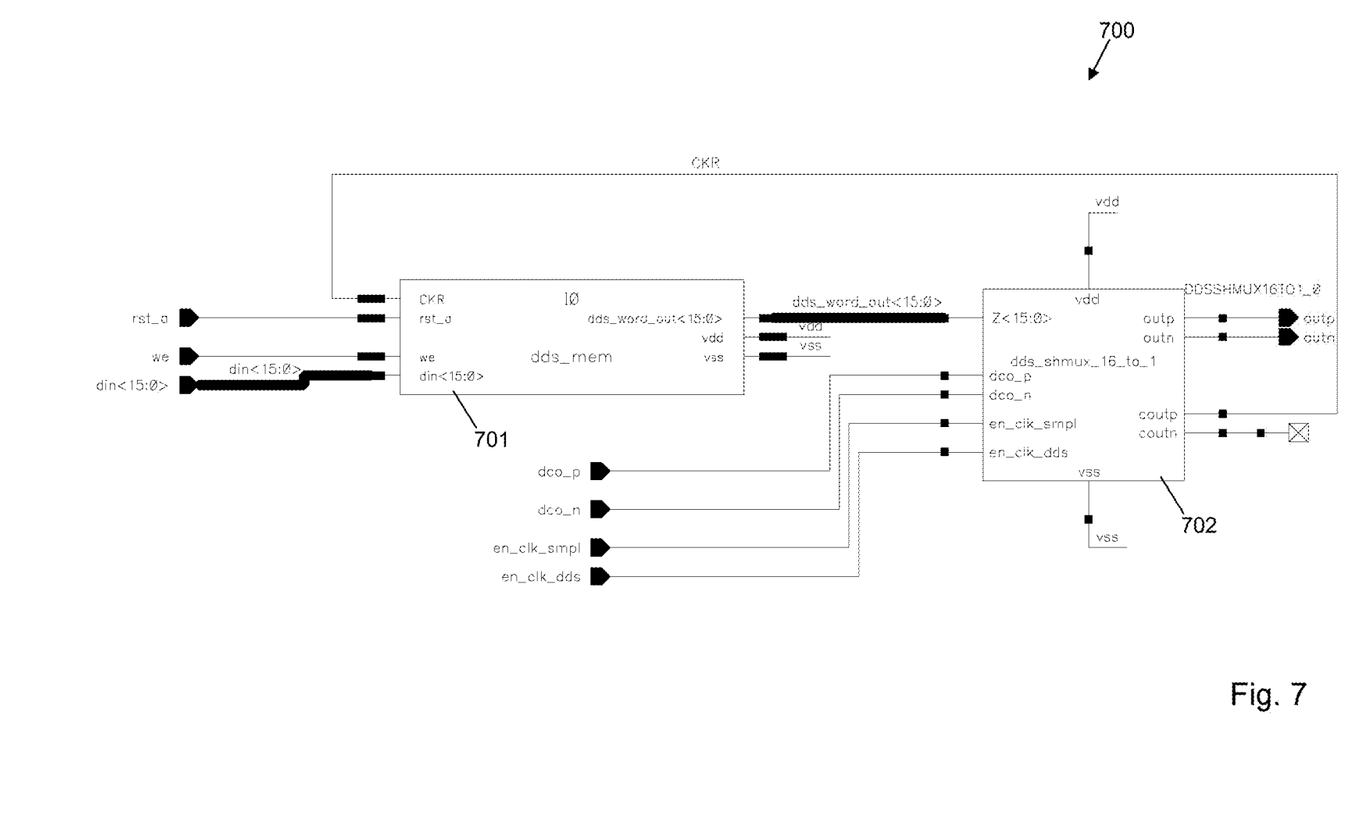
FIG. 7 is an exemplary circuit block diagram of a bit sequence generator in combination with a digital signal generator.

A block diagram of an exemplary local oscillator signal generator 700 is shown in FIG. 7, comprising a memory module 701 connected to a signal generator module 702. As with the other embodiments described above, the digital signal generator module 702 comprises clock dividers, a divided clock signal coutp being provided to a clock signal input CKR of the memory module 701 to control the output of the memory module 701. The memory module 701 provides a 16 bit word to the digital signal generator module 702, and the digital signal generator module 702 provides a serial output bit sequence corresponding to the input parallel bit sequence.

Figure 8:
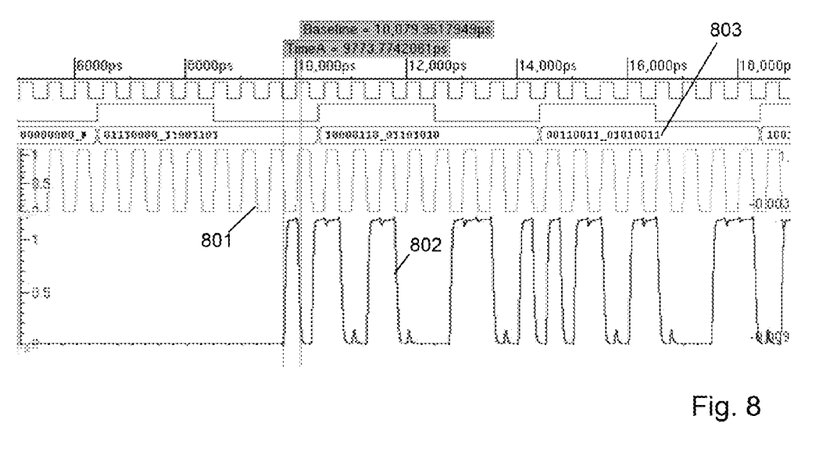
FIG. 8 is a plot of output clocked waveforms from a digital signal generator.

FIG. 8 illustrates an output signal 802 from a digital signal generator provided under control of a clock signal 801 and a series of bit sequences provided at an input of the digital signal generator.

To simplify high speed clock generation, the clock divider chain of the digital signal generator is preferably composed of divide by two dividers, although other implementations are also possible with different multiplexer tree topologies. Where the input clock signal is divided by two, the data input has width of $2^n+1$, where n is the number of stages. An arbitrary phase signal may however have a period that cannot be represented with such a format. In such cases, the memory (or look-up table) may be implemented in such a way as to give a different input pattern on each falling edge of the output clock (i.e. clock signal clk_div4 in FIG. 2, or CKR in FIG. 7, described below). In some embodiments the memory could be in the form of a multi-port memory.

Figure 9:
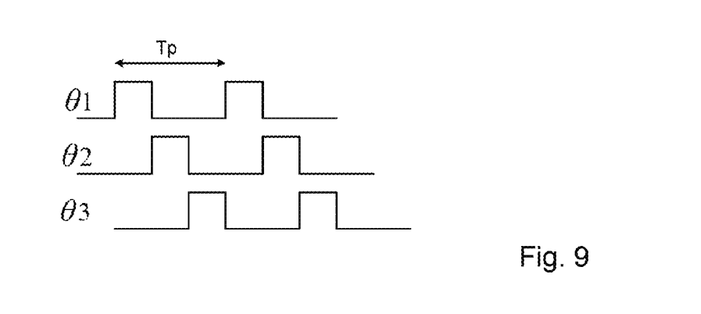
FIG. 9 is a schematic diagram showing three phased waveforms having a common time period.
Figure 10:
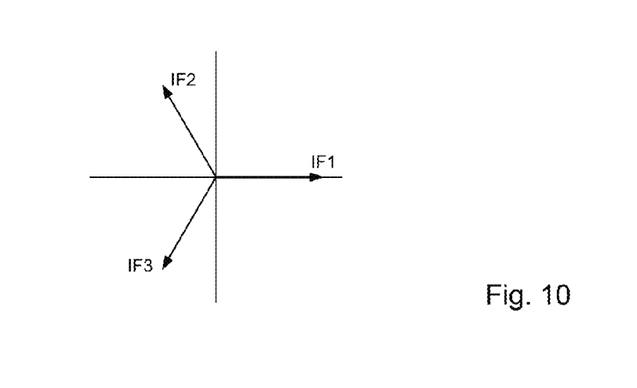
FIG. 10 is a diagram showing the relative phases of the different waveforms in FIG. 9.
Figure 11:
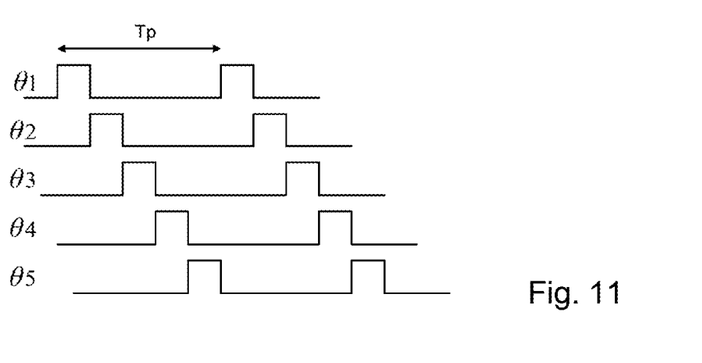
FIG. 11 is a schematic diagram showing five phased waveforms having a common time period.
Figure 12:
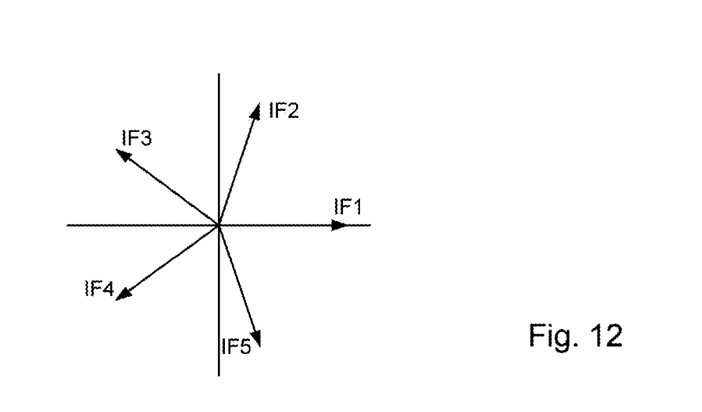
FIG. 12 is a diagram showing the relative phases of the different waveforms in FIG. 11.

FIGS. 9 and 10 illustrate an example of a three-phase signal having a period $T_p$, where three output signals $\theta_1, \theta_2, \theta_3$ are to be generated at equally spaced phases, indicated by the phase diagram in FIG. 10. FIGS. 11 and 12 illustrate a further example of a five-phase signal, in which five output signals $\theta_1, \theta_2, \theta_3, \theta_4, \theta_5$ are to be generated. These types of signals can be obtained by providing appropriate bit sequences at the parallel inputs of digital signal generators in accordance with embodiments of the invention.

As an illustrative example, the LUT data for a 4-stage digital signal generator module may be programmed as follows:

```
MEM <= (
    "0111000011001101",
    "0000000000101010",
);
```

The period of the output clock is set to 19, which is one half of the DCO period, while the multiplexer tree of the digital signal generator has a 16 bit input.

By combining multiple one-bit pattern generators, multiphase LO signals can be generated. The circuit block could also be shared between phases. For instance, one divider chain with appropriate buffering, could be configured to clock multiple phases. Since phase noise is defined by the first stage of the digital signal generator, operating at the highest clock frequency, when all phases are clocked from the same source very good alignment can be achieved.

Local oscillator signal generators in accordance with embodiments of the invention may be implemented in multi stream applications, where coupling between digital controlled oscillators (DCOs) may be an issue. To prevent coupling, the DCO central frequencies tend to be all fractionally related, for example by ¾. A particular goal in one application is to cover all reception frequencies for TV and DAB (digital audio broadcasting) radio standards, which range from 45 to 2660 MHz. With conventional divider circuits having ratios of 2, 3, 4, and 5, the tuning range for the DCO would need to be large. Using local oscillator signal generators according to embodiments of the invention, however, allows for fractional division with IQ signal generation.

A multi-phase LO source may for example be programmed for fractional division by 1.5 to produce a 3-phase signal (FIGS. 9 and 10), with a sequence length 18, by using the following LUT data:

```
MEM_PH1 <= (
  "1001001001001001",
  "0000000000000000",
MEM_PH2 <= (
  "0100100100100100",
  "1000000000000000",
MEM_PH3 <= (
  "0010010010010010",
  "0100000000000000",
```

The IQ mixer can then be implemented with a weighted summation of mixer outputs driven by a multiphase signal. This effectively lowers the tuning range needed for the DCO.

Figure 13:
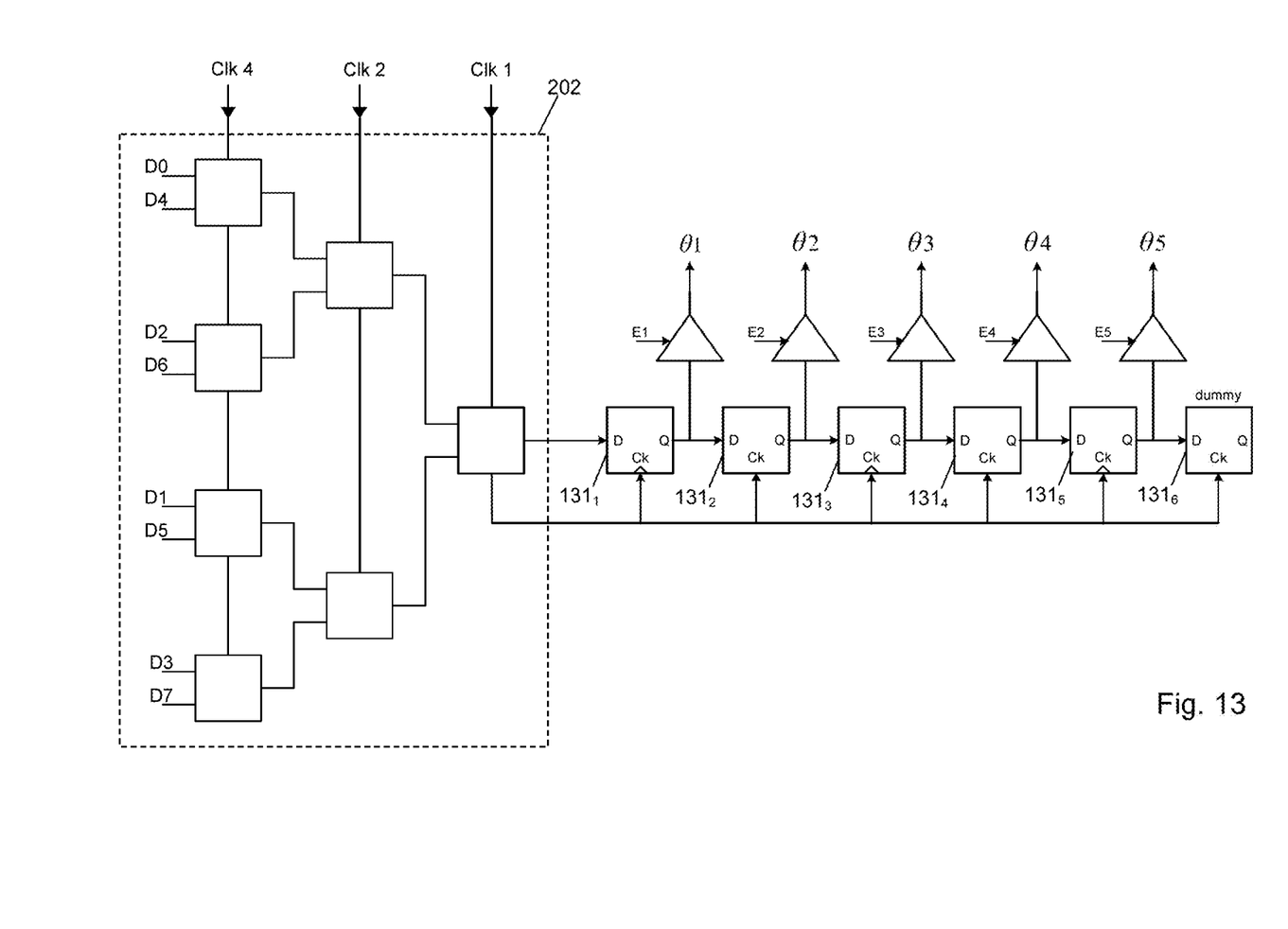
FIG. 13 is a schematic block diagram of an exemplary digital signal generator in combination with a series of clocked shift registers.

The general form of LO generator shown in FIG. 3 can be simplified when there is a similarity between different phases, in which case a single stage digital signal generator in combination with an output stage comprising a sequence of shift registers connected in series to the serial output of the digital signal generator can be implemented. An exemplary embodiment is illustrated in FIG. 13. In this case, a single digital signal generator 202 is used to determine an output bit sequence, which is progressively shifted in phase by a series of shift registers $131_{1-5}$. (with a dummy shift register $131_6$ at the end of the chain), providing a series of phased output signals $\theta_1, \theta_2, \theta_3, \theta_4, \theta_5$. Unused outputs are switched off. Registers could be also implemented as gated inverters.

Figure 14:
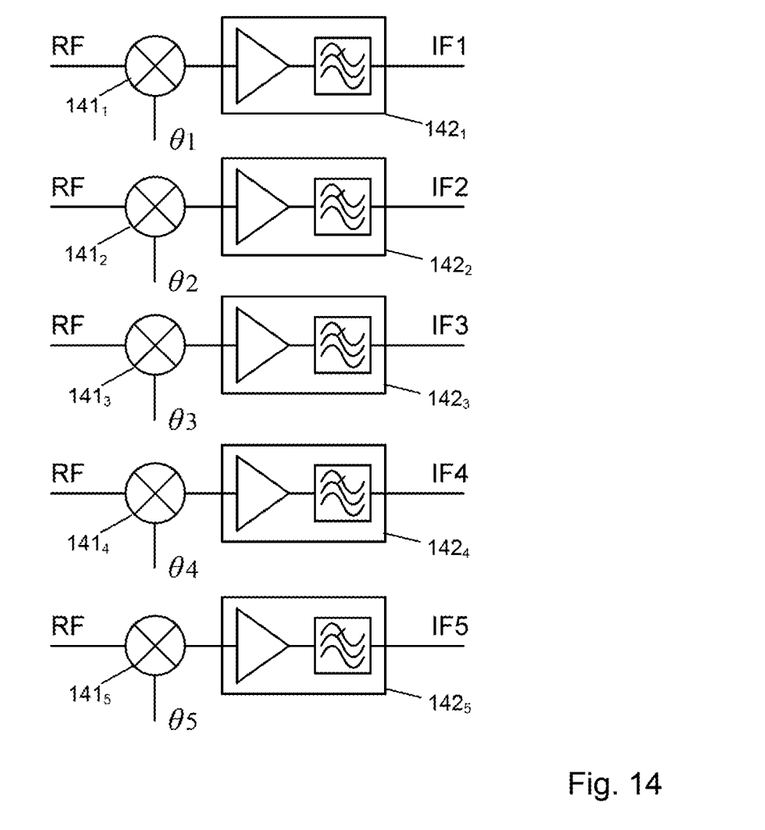
FIG. 14 is a schematic block diagram of a multiphase down-converter for connection with multiple local oscillator signals from the digital signal generator of FIG. 13.

The phased output signals $\theta_1, \theta_2, \theta_3, \theta_4, \theta_5$ can be provided to a multiphase downconverter, an example of which is illustrated in FIG. 14. In this, 5 mixers $141_{1-5}$ are provided with the phased output signals and with an input RF signal. The mixed outputs are each provided to IF amplifiers $142_{1-5}$ to provide phased intermediate frequency output signals.

For a harmonic rejection mixer that has an even number of phases, a LO generator implementation may be simplified to have a LUT with a constant output, so the even and the odd path of each element could have only two gated inverters. For a 16-phase mixer the LUT can be programmed as follows

```
MEM_PH1 <= (
  "0000000011111111",
MEM_PH2 <= (
  "1000000011111111",).
```

For a 4 phase mixer the LUT can be

```
MEM_PH1,MEM_PH2,MEM_PH3,MEM_PH4 <= (
  "0011001100110011",
MEM_PH5,MEM_PH6,MEM_PH7,MEM_PH8 <= (
  "1001100110011001",
```

As an example, to create a mixing waveform for reception at 869 MHz a local oscillator source will need to be clocked by 1720 MHz.

The clock for the HR mixer and for the ND converter could be also generated with a one bit LO source. The main advantages are flexibility in divider ration (division by 2, 3, 4, 5, 6, and 7), and low phase noise as the last stage is re-clocked with the DCO clock Other embodiments are also envisaged to be within the scope of the invention, as defined by the appended claims.

REFERENCES

1. "A DDFS Driven Mixing-DAC with Image and Harmonic Rejection Capabilities", Maxim, A. Poorfard, R. Reid, M. Kao, J. Thompson, C. Johnson, R.; Solid-State Circuits Conference, 2008. ISSCC 2008. Digest of Technical Papers. IEEE International, 3-7 Feb. 2008, pp 372-621.
2. Mensink et al "Distortion Cancellation by Polyphase Multipath Circuits", IEEE Transactions on Circuits and Systems-I: Regular Papers, Vol. 52, No. 9, September 2005.
3. WO 2009/057051.

The invention claimed is:

1. A local oscillator signal generator for a mixer of a radiofrequency receiver, the signal generator comprising:
    a bit sequence generator having a plurality of parallel output lines;
    a digital signal generator having a serial output line, a plurality of input lines connected to respective output lines of the bit sequence generator, and a plurality of parallel to serial multiplexer modules, each multiplexer module configured to provide a serial output from a pair of parallel inputs; and
    a clock signal input line connected to the digital signal generator,
    wherein the digital signal generator is configured to provide an output bit sequence on the serial output line to the mixer at a rate given by a single-phase clock signal provided to the digital signal generator on the clock signal input line and a sequence given by a sequence of bits from the bit sequence generator on the plurality of input lines.

2. The local oscillator signal generator of claim 1 wherein the bit sequence generator comprises $2^n$ parallel output lines where n is a positive integer, and wherein the multiplexer modules are arranged in stages from a first stage comprising one multiplexer module to an $n^{th}$ stage comprising $2^{n-1}$ multiplexer modules, the second to $n^{th}$ having twice the number of modules of a preceding stage and having serial outputs connected to parallel inputs of modules of the immediately preceding stage.

3. The local oscillator signal generator of claim 2 comprising n−1 clock signal dividers configured to provide an output clock signal at half the rate of an input clock signal and connected between clock signal inputs of multiplexer modules of adjacent stages,
    wherein the clock signal input line is connected to a first one of the clock signal dividers and to the clock signal input of the multiplexer module of the first stage such that the multiplexer module of the first stage provides the serial digital signal output at the rate of a clock signal applied to the clock signal input line.

4. The local oscillator signal generator of claim 3 wherein an output of the n−$1^{th}$ clock signal divider is connected to a clock signal input of the bit sequence generator.

5. The local oscillator signal generator of claim 4 wherein the bit sequence generator is configured to provide successive bit sequences to the parallel inputs of multiplexer modules of the $n^{th}$ stage in response to successive pulses of a clock signal applied to the clock signal input from the $n-1^{th}$ clock signal divider.

6. The local oscillator signal generator of claim 4 or claim 5 wherein the output of the $n-1^{th}$ clock signal divider is connected to the clock signal input of the bit sequence generator via an inverted output.

7. The local oscillator signal generator claim 2, wherein n is greater than or equal to 2.

8. The local oscillator signal generator of claim 1, comprising a sequence of shift registers connected in series to the serial output of the digital signal generator.

9. A local oscillator signal generator for a mixer of a radiofrequency receiver, the signal generator comprising:
 a plurality of memory modules, each having a plurality of parallel output lines;
 a plurality of digital signal generator modules each having a serial output line and a plurality of input lines;
 a bit shifter module coupled to the pluralities of parallel output lines of the plurality of memory modules and to the pluralities of input lines of the plurality of digital signal generator modules; and
 a clock signal input line,
 wherein each digital signal generator module is configured to provide an output bit sequence to the mixer on the serial output line at a rate given by a single-phase clock signal provided on the clock signal input line and a sequence given by a sequence of bits from a corresponding memory on the plurality of input lines.

10. A method of operating a local oscillator signal generator, the method comprising:
 generating a sequence of bits at a bit sequence generator having a plurality of parallel output lines;
 providing the sequence to a digital signal generator at a plurality of parallel input lines, the parallel input lines coupled to a plurality of parallel to serial multiplexer modules, each multiplexer module configured to provide a serial output from a pair of parallel inputs;
 providing a single-phase clock signal to the digital signal generator on a clock signal input line; and
 providing an output bit sequence on a serial output line of the digital signal generator to a mixer at a rate given by the single-phase clock signal provided on the clock signal line and corresponding to the sequence of bits from the bit sequence generator.

* * * * *